United States Patent [19]

Anhalt

[11] Patent Number: 5,244,397
[45] Date of Patent: Sep. 14, 1993

[54] IC CARD AND CABLE HARNESS

[75] Inventor: John W. Anhalt, Orange, Calif.

[73] Assignee: ITT Corporation, Secaucus, N.J.

[21] Appl. No.: 984,196

[22] Filed: Nov. 20, 1992

[51] Int. Cl.$^5$ .............................................. H01R 4/66
[52] U.S. Cl. .................................. 439/101; 361/730; 361/737
[58] Field of Search ................... 439/55, 60, 62, 101, 439/610; 361/394, 395

[56] References Cited

U.S. PATENT DOCUMENTS

| | | | |
|---|---|---|---|
| 3,643,208 | 2/1972 | Massa, Jr. ............................ | 339/102 |
| 4,439,809 | 3/1984 | Weight et al. ........................ | 361/220 |
| 4,655,515 | 4/1987 | Hamsher, Jr. et al. ............... | 339/14 |
| 4,806,107 | 2/1989 | Arnold et al. ......................... | 439/79 |
| 4,849,944 | 7/1989 | Matsushita ............................ | 371/21 |
| 4,872,091 | 10/1989 | Maniwa et al. ...................... | 361/424 |
| 4,889,495 | 12/1989 | Kimura ................................. | 439/60 |
| 4,889,497 | 12/1989 | Riches .................................. | 439/76 |
| 4,925,400 | 5/1990 | Blair et al. ........................... | 439/374 |
| 4,932,888 | 6/1990 | Senor ................................... | 439/108 |
| 5,016,086 | 5/1991 | Inoue et al. ......................... | 361/395 X |
| 5,040,998 | 8/1991 | Suzuki et al. ....................... | 439/79 |
| 5,055,070 | 10/1991 | Plegge et al. ...................... | 439/610 X |
| 5,057,028 | 10/1991 | Lemke et al. ...................... | 439/101 |
| 5,092,799 | 3/1992 | Kimura .............................. | 439/924 |
| 5,184,282 | 2/1993 | Kaneda et al. ................... | 439/62 X |
| 5,196,944 | 3/1993 | Tanuma et al. .................. | 439/60 X |

Primary Examiner—Eugene F. Desmond
Attorney, Agent, or Firm—Thomas L. Peterson

[57] ABSTRACT

An IC card (10, FIG. 1) and a cable harness (14) which can connect to the input/output port at the rear of the card, are provided, which have effective grounding contacts. The cable harness (14) has a cable connector (60) with a pair of laterally-spaced plug parts (90, 92) holding contacts and pluggable into corresponding recesses at the rear of the card, and has a grounding cable contact (74) of pin shape lying between the plug parts. The grounding pin is exposed, but is protected by the plug parts. The card has a frame (16) with an integrally molded rear connector (42), and a circuit board (20) is mounted on the frame. The circuit board has a lower surface (154, FIG. 6) with a ground plane (156) at the rearward portion thereof, and has an upper surface (140, FIG. 5) with two rows of signal traces (142, 144) and with a ground trace (152) between them, the ground trace being connected through the board to the ground plane on the lower surface of the board. The rear of the frame forms a passage (180, FIG. 7) for holding a grounding socket contact (80), the passage being formed by vertical holes (191-195) extending alternately from the top and from the bottom surface of the frame and across the passage.

14 Claims, 5 Drawing Sheets

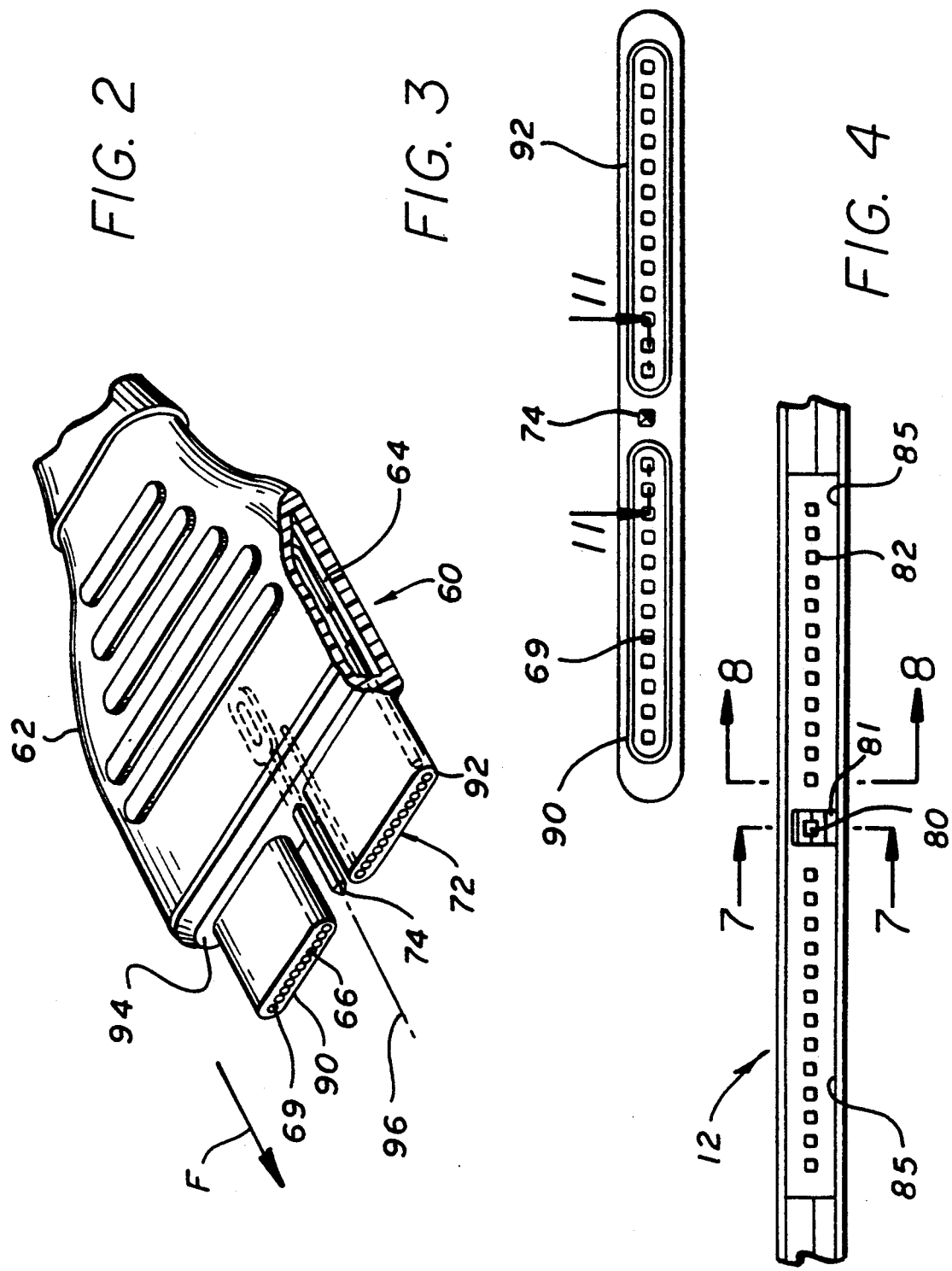

5,244,397

IC CARD AND CABLE HARNESS

BACKGROUND OF THE INVENTION

IC cards, which are often memory cards, are commonly constructed with a molded plastic frame having opposite sides and ends, a combination circuit board and front connector installed on the frame, and top and bottom metallic covers. Such IC cards are especially useful in electronic apparatus of very small thickness, such as lap top computers of the size of a sheet of paper and with a thickness of much less than one inch. Standard JEIDA IC cards have a thickness of 5 millimeters, which enables them to be inserted into thin slots of the electronic apparatus.

The usefulness of the memory cards can be enhanced by providing a rear input/output port, and a cable harness that can connect to the port. It is highly desirable to provide heavy duty grounding contacts on the cable harness and card, which can discharge large amounts of static electricity before signal contacts are engaged. Because of the small thickness of the card and the even smaller thickness of cable connector parts that must plug into the rear of the card, it is difficult to provide room for accommodating the separate grounding contacts. An IC card and a cable harness connectable to the input/output port of the card, which could be reliably constructed to small thicknesses, would be of considerable value.

SUMMARY OF THE INVENTION

In accordance with one embodiment of the present invention, an IC card and cable harness are provided, which have compact grounding means for grounding the cable connector to the rear of the card as they are mated. The cable connector has a pair of laterally-spaced plug parts that each holds a row of signal contacts, with each plug part received in a recess at the rear of the card. The cable connector also has a grounding cable contact, preferably in the form of a pin, which lies between the plug parts and which is exposed rather than being surrounded by insulation. The absence of insulation around the grounding pin allows a thick grounding pin to be used, which can be received in a corresponding grounding contact at the rear of the card, without having to provide enough card thickness to receive any insulation around the grounding pin.

The card includes a molded frame with an integrally molded rear connector and with beams of the frame that support the card circuit board and the covers. The circuit board has a lower surface with a ground plane extending to the rear end portion thereof, and an upper surface with two rows of signal traces that each connect to a corresponding signal contact. The upper surface has a grounding trace lying between the two aligned rows of signal traces, for connection to a tail of the grounding socket contact. The grounding trace on the upper surface of the board, is connected to the ground plane on the lower surface of the circuit board.

The grounding socket contact at the rear of the card lies in a first passage. The passage has a restriction at its rear that is only slightly wider than the grounding pin on the cable connector, and has a wider main passage part forward of the restriction. The main passage part is formed by a plurality of vertical holes that alternate between downward holes extending through the top surface of the frame to the bottom of the passage, and upward holes extending through the bottom of the frame to the top of the passage. The front most of the holes is a downward-extending hole which forms a ramp at the bottom of the passage that facilitates passage of a projection on the socket contact, with the projection abutting a shoulder to retain the socket contact.

The novel features of the invention are set forth with particularity in the appended claims. The invention will be best understood from the following description when read in conjunction with the accompanying drawings.

BRIEF DESCRIPTION OF THE DRAWINGS

FIG. 2 is a partial sectional isometric view of a cable harness similar to that of FIG. 1, but having more signal contacts.

FIG. 3 is a front elevation view of the cable harness of FIG. 2.

FIG. 4 is a partial rear elevation view of an IC card similar to that of FIG. 1, but having more signal contacts.

DESCRIPTION OF THE PREFERRED EMBODIMENT

Figure 1:
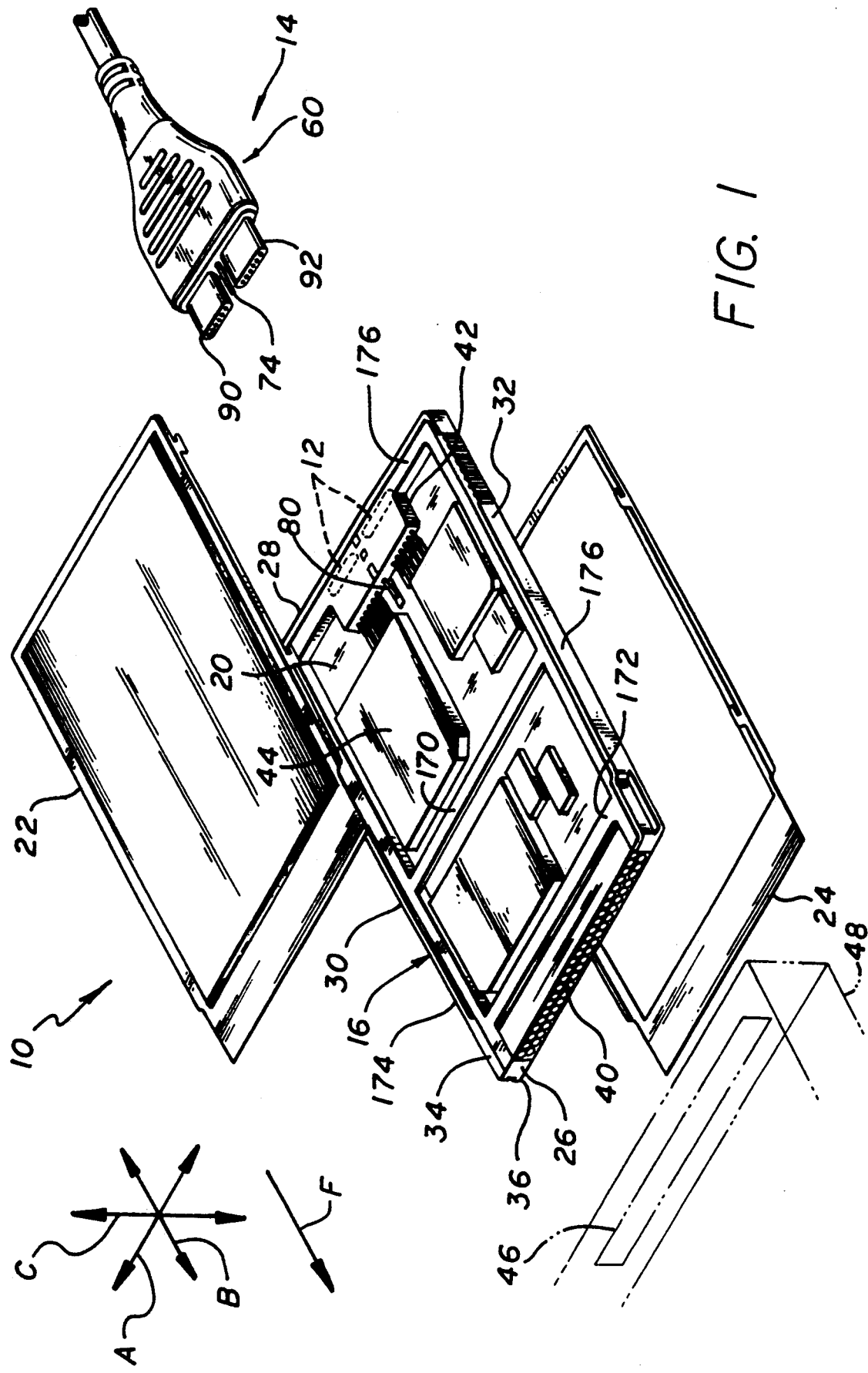
FIG. 1 is a simplified exploded isometric view of an IC card and cable harness connectable thereto.

FIG. 1 shows an IC card 10 which has an input/output port 12 at its rear, and also shows a cable harness 14 that connects to the input/output port. The IC card, which is often a memory card that stores information although it can have other circuitry, includes a preferably dielectric frame 16, a card circuit board 20 mounted on the frame, and top and bottom covers 22, 24 which cover the top and bottom of the frame and enclose the circuit board therein. The card and frame have front and rear ends 26, 28 spaced apart in a longitudinal direction indicated by arrow B, first and second opposite sides 30, 32 spaced apart in a lateral direction indicated by arrow A, and top and bottom surfaces 34, 36 spaced apart in a vertical direction indicated by arrow C. A front card connector 40 is attached to the circuit board and lies at the front of the frame. A rear card connector 42 lies at the rear of the frame and has an insulative housing that is molded integrally with the frame. Contacts of the front and rear connectors are connected to circuit components 44 mounted on the circuit board. The card is designed to be inserted into a narrow slot 46 in an electrical apparatus 48 such as a thin lap top computer.

It should be noted that while terms such as "vertical", "top", "bottom" and the like are used herein to help explain the apparatus as illustrated, the apparatus can be used in any orientation with respect to gravity.

Figure 9:
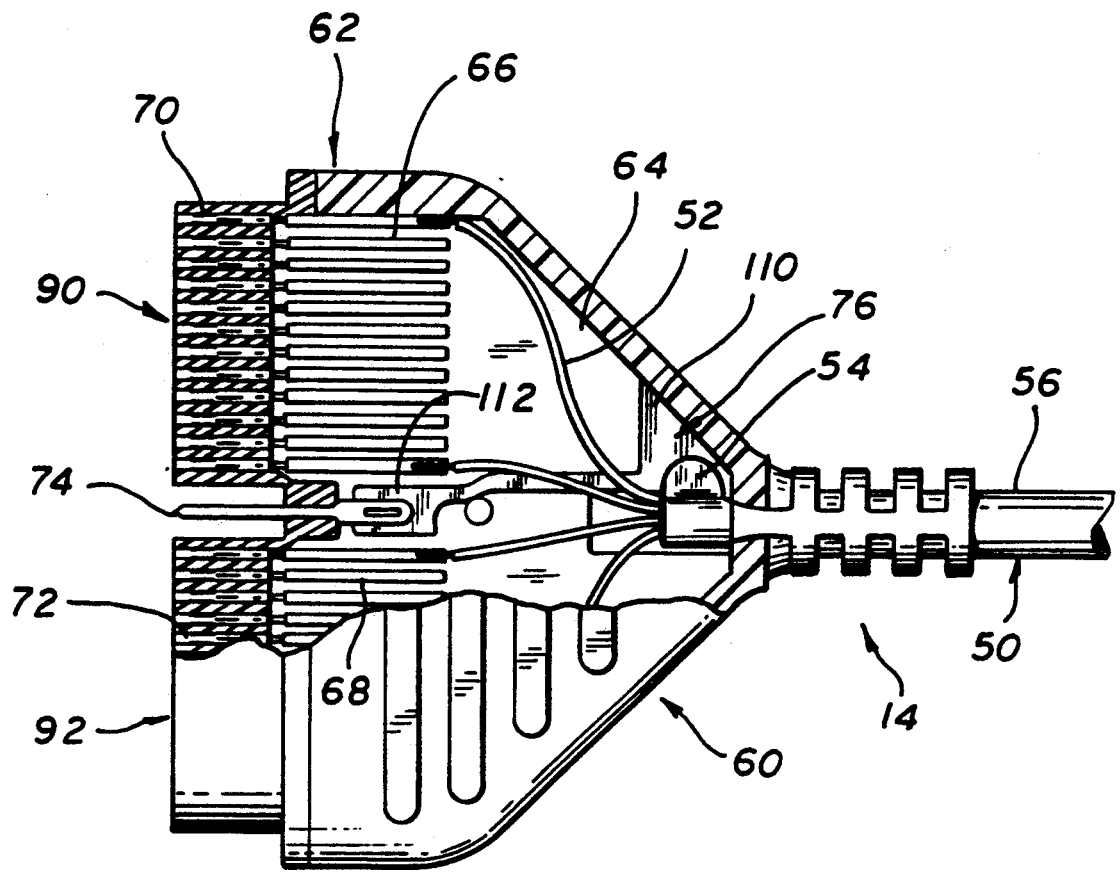
FIG. 9 is a sectional top view of the cable harness of FIG. 2.

As shown in FIG. 9, the cable harness 14 includes a cable 50 having a plurality of wires 52 and a ground shield 54 lying around the wires. An insulative jacket 56 lies around the cable ground shield. The cable harness includes a cable connector 60 attached to the front end of the cable. The cable connector includes an insulative housing 62 and a cable connector circuit board 64 in the housing. The circuit board 64 has two rows of conductive signal traces 66, 68, that are aligned in that they lie in substantially a common horizontal plane. Each wire 52 of the cable is connected to a corresponding signal trace. The connector also includes signal contacts 69 arranged in two rows 70, 72, with each signal contact connected to a corresponding signal trace such as 66. The connector also includes a grounding plug or cable contact 74 which is electrically coupled to the cable ground shield 54 through a ground trace 76 on the circuit board.

Figure 7:
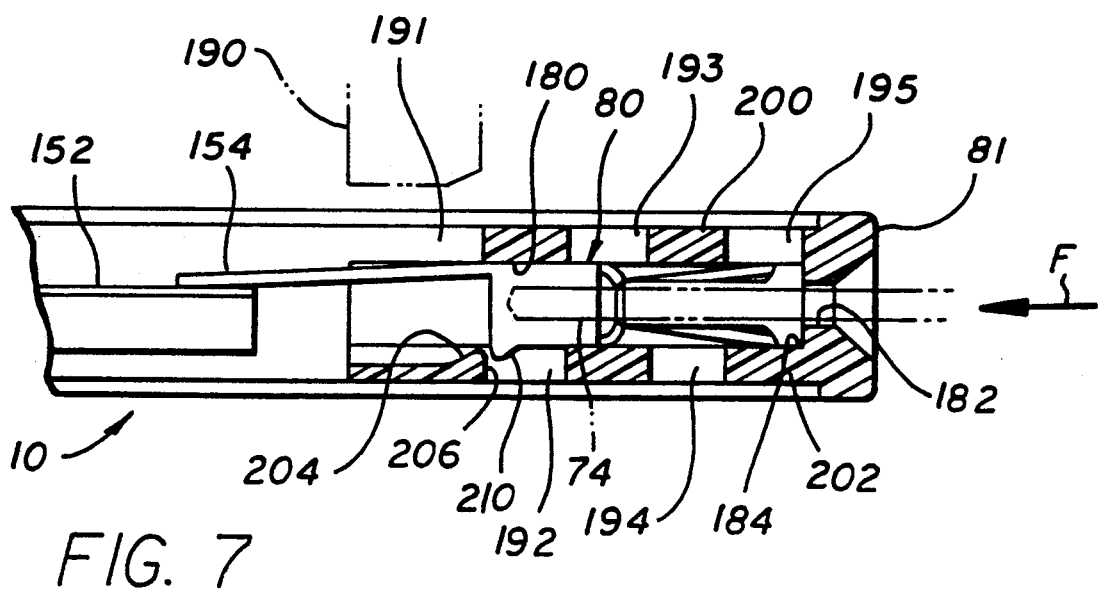
FIG. 7 is a view taken on the line 7—7 of FIG. 4.
Figure 8:
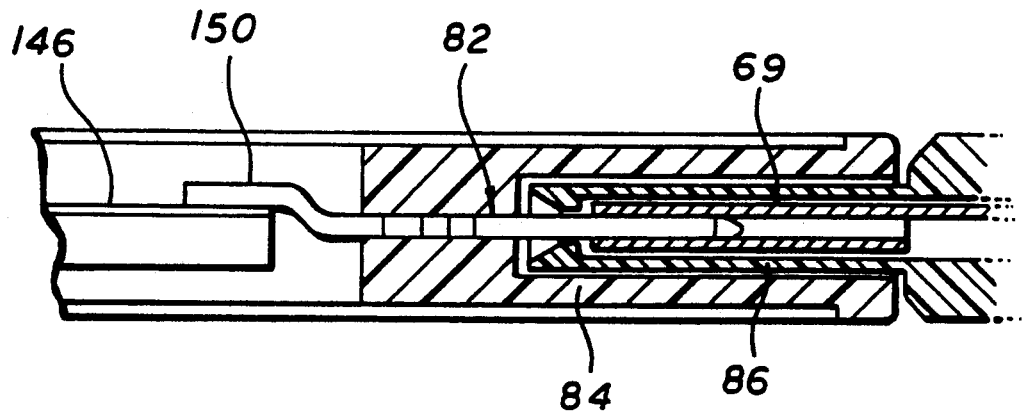
FIG. 8 is a view taken on the line 8—8 of FIG. 4.

As shown in FIG. 7, the grounding cable contact 74 mates with a grounding socket contact 80 at the middle 81 of the rear of the IC card 10, when the cable connector is plugged into the card input/output port at the card rear. During such plug-in, each cable harness signal contact 69 (FIG. 8) receives a card signal contact 82. It is important that the grounding contacts 74, 80 of FIG. 7 engage each other to dissipate any static electricity, before any of the signal contacts 69, 82 engage each other. When the grounding contacts 74, 80 mate, a large current may flow between them, and they must have a considerable cross section to carry such current without damage. This can be contrasted with the signal contacts 69, 82, which are designed to carry small currents, although they can carry small amounts of current for powering components.

In common practice, all contacts of a connector are surrounded by a dielectric. Thus, in FIG. 8, the card signal contact 82 is surrounded by rear card connector walls 84 that form a plug-receiving cavity 85. Similarly, the cable connector signal contacts 69 are surrounded by dielectric walls 86 of the cable connector housing. These interfitting walls result in a considerable thickness for the card, which is minimized by using thin walls and contacts. Because of the greater thickness required for the grounding contacts, it is difficult to provide room for such interfitting dielectric walls.

Applicant avoids the need for interfitting dielectric walls extending around the grounding contacts by constructing the cable connector 60 as shown in FIG. 2. The housing 62 of the cable connector is formed with two plug parts 90, 92 that project in a forward longitudinal direction F from a forwardly-facing shoulder 94. The shoulder is not necessarily used to limit depth of insertion. Each row 66, 72 of cable signal contacts lies in a different one of the plug parts 90, 92. The plug parts 90, 92 are laterally spaced apart, and the grounding cable contact 74 lies between them. The grounding cable contact extends along a longitudinal axis 96, and at least the forward portion 98 of the grounding cable contact, which is inserted into the corresponding grounding card socket contact, is exposed in directions radial to the axis 96. That is, the contact forward portion is not surrounded by any insulation lying directly radially (with respect to axis 96) away from the forward portion. Applicant can expose the grounding cable contact 74 because it is of considerable width along both horizontal and vertical directions, so it can withstand moderate bending forces, and because it is protected by the plug parts 90, 92 which it lies between. As mentioned above, the avoidance of a dielectric enclosure around the grounding cable contact 74, avoids the need for an increased thickness of the card to receive such enclosure.

Figure 10:
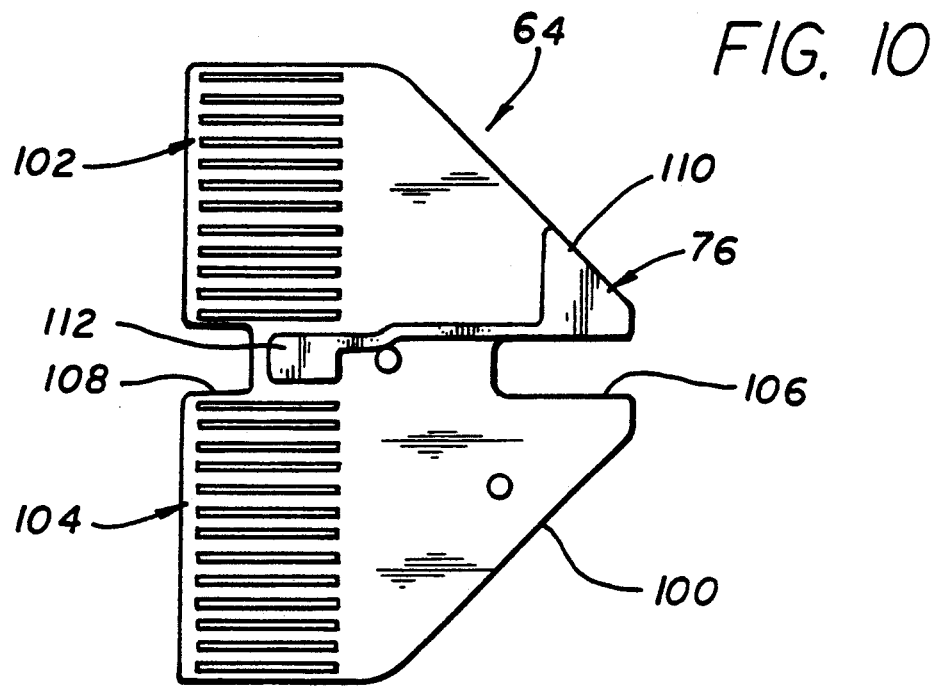
FIG. 10 is a plan view of the cable connector circuit board of the harness of FIG. 9.

FIG. 9 shows some details of the cable connector 60 and of the cable connector circuit board 64. As shown in FIG. 10, the circuit board 64 includes a dielectric board part 100 with two rows of conductive signal traces 102, 104 and with a grounding trace 76. The board has a rear slot 106 for receiving the forward end of the cable, and has a front slot 108 for passing the middle of the grounding plug contact. As shown in FIG. 9, the cable shield 54, which may be a braiding or foil, is slightly unwound from around the wire, and is soldered to a rear portion 110 of the grounding trace 76. The grounding trace has a forward portion 112, to which the grounding contact 74 is soldered.

Figure 11:
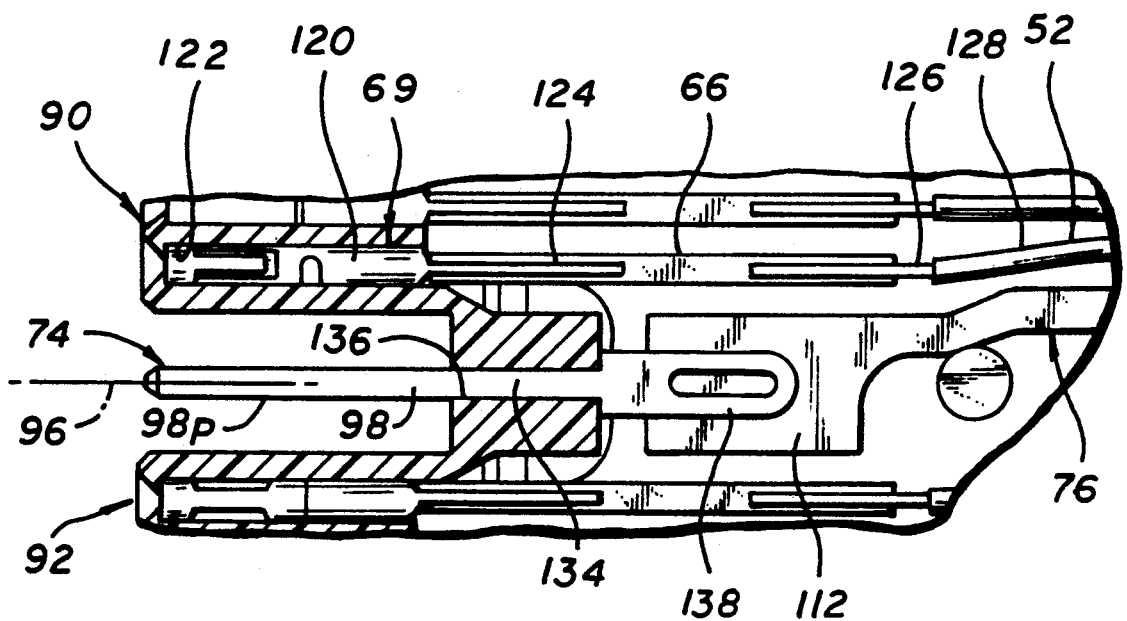
FIG. 11 is a view taken on the line 11—11 of FIG. 3.

As shown in FIG. 11, each signal contact 69 of the cable connector includes a forward part 120 that lies in a contact-receiving passage 122 of the plug part 90 of the connector housing. Each signal contact also has a rearward termination or tail 124 that lies in a corresponding signal trace such as 66A, onto which it is soldered (the solder is not shown). Each cable wire 52 includes an electrical conductor 126 and an insulation 128 around it. Each electrical conductor 126 is soldered to the corresponding signal trace 66.

The grounding cable contact 74 has a forward portion 98 that forms a pin and that is exposed, as described above. Most of the forward portion is formed by a front end part 98p which is actually received in the card grounding contact. The middle 134 of the contact is an extension of the pin-shaped forward portion, and lies in a passage 136 of the connector housing. The grounding contact has a rearward portion 138 which is soldered to the forward portion 112 of the grounding trace 76.

Figure 5:
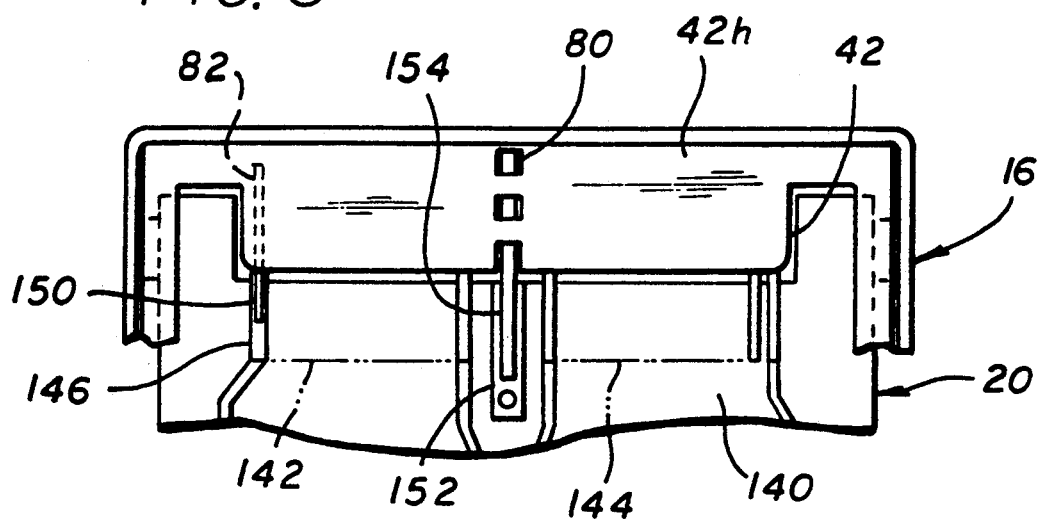
FIG. 5 is a partial plan view of the frame and circuit board of an IC card similar to that of FIG. 1.
Figure 6:
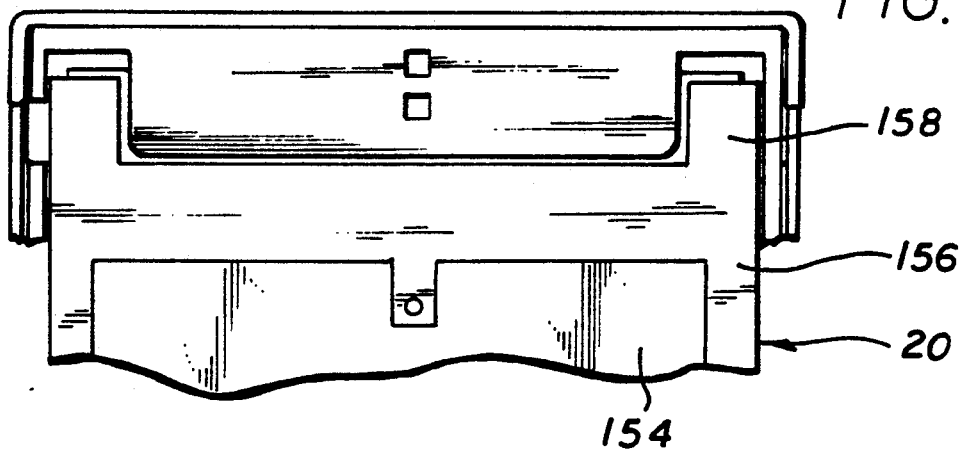
FIG. 6 is a bottom view of the frame and circuit board of FIG. 5.

FIG. 5 shows some details of the rearward portion of the card circuit board 20 which lies on the frame 16 and which carries circuit components such as integrated circuits. The upper surface 140 of the board includes two aligned rows 142, 144 of signal traces 146. Each card signal contact 82 has a tail 150 engaged with a corresponding signal trace 146 and soldered thereto. Most signal traces are connected to circuit components on the circuit board. The upper surface of the circuit board also includes an upper ground trace 152. The ground socket contact 80 has a termination or tail 154 which is soldered to the ground trace 152. The lower surface 154 (FIG. 6) of the board has a ground plane 156 thereon, that includes a rear portion 158 at the rear of the card. The ground plane helps to prevent crosstalk between different conductors on the circuit board and helps prevent electromagnetic interference from outside sources. The ground plane 156 is connected to the upper ground trace 152 at the top of the board, by a plated through hole 160. Thus, while the signal traces generally extend along the upper surface of the board, and the ground plane extends along much of the lower surface of the board, the ground socket contact can be connected to a trace at the top of the board and still be connected to the circuit board ground plane.

As shown in FIG. 1, the frame 16 includes mid and forward cross beams 170, 172 extending between opposite side beams 174, 176. The cross beams and side beams are integrally molded with a rear beam 176 that is integrally molded with the housing 42h of the rear card connector 42. The presence of the cross beams affects the construction of the passage which holds the rear portion of the ground socket contact 80.

As shown in FIG. 7, the ground socket contact 80 lies in a ground contact passage 180 that has an end restriction at 182. The end restriction prevents receipt of an oversize pin that could damage the socket contact. The passage 180 includes a main portion 184 which extends forward of the end restriction 182 and which has a much larger width (both horizontally and vertically) than the end restriction. In molding such a passage, it would be common to use one core forming the end restriction 182 and portions rearward thereof, and another core forming the main portion 184. Such cores would have to be withdrawn before the molded part could be withdrawn from the mold. However, the presence of the integrally molded cross beams lying forward of the main portion 184, takes up room that would be otherwise occupied by such a core and its guiding and retracting mechanism. To avoid the need for such a forwardly retractable core, applicant molds the main passage 184 by means of vertically moving cores, such as one indicated at 190 in its retracted position.

The vertically moving cores used to form the passage 180, form vertically-extending holes 191-195. Three of the holes 191, 193, and 195 extend vertically downwardly through a frame upper wall 200 and across the entire height of the passage. Two other holes 192, 194 extend through the bottom wall 202 of the passage and vertically across the height of the passage. It would be possible to form the passage with only three vertical holes, but the five vertical holes help stabilize the position of the socket contact in the passage. The frontmost hole 191 forms a ramp 204 that extends at an upward-rearward incline. The second hole 192 forms a retainer shoulder 206 rearward of the ramp. The socket contact has a retainer 210 which, when the socket contact is inserted in the rearward direction through the passage, rides up the ramp 204 and then abuts the shoulder 206. It may be noted that the socket contact 80 is resiliently compressible in height, which assures its secure retention in the passage.

Thus, the invention provides a cable harness with a connector for mating with an input/output port at the rear of an IC card, and a card with a rear connector constructed to receive the cable connector, which provides effective grounding in a construction that enables the cable connector and card to have a small height. The cable connector includes a pair of laterally-spaced plug parts that each holds a row of signal contacts, and a grounding cable contact lying between the plug parts, with the grounding contact being exposed. The exposure of the grounding cable contact avoids the need for increased height of the card rear connector to receive any enclosure around the grounding contact of the connector. The exposed grounding contact is preferably of pin shape to provide increased strength and avoid crevices that can hold dirt. The card includes a circuit board with a lower face having a ground plane at the rear thereof and an upper face having two horizontally aligned rows of signal traces and a ground trace between the rows. The ground trace on the upper surface of the board is connected to the ground plane on the lower surface of the board. The passage that holds the card grounding contact can be formed by a plurality of vertical holes extending through upper and lower walls of the passage. The frontmost hole has a lower portion forming a ramp that facilitates installation of a socket ground contact that has a projection which lies against a shoulder formed in the second from frontmost hole.

Although particular embodiments of the invention have been described and illustrated herein, it is recognized that modifications and variations may readily occur to those skilled in the art, and consequently, it is intended that the claims be interpreted to cover such modifications and equivalents.

I claim:

1. A cable harness for connecting to the rear of an IC card, which includes a cable having a plurality of wires and a grounding shield around the wires, a cable connector having an insulative housing with laterally-spaced opposite sides, and having a front end portion with a substantially forwardly-facing shoulder and with a pair of laterally spaced plug parts each having a row of contact-receiving passages with the passages being laterally spaced apart along the row, and a plurality of cable signal contacts each having a forward part lying in one of said passages and a rearward part electrically coupled to a different one of said wires, characterized by:

a grounding cable contact having a rearward portion electrically coupled to said cable shield and a sidewardly exposed forward portion projecting forwardly of said shoulder and lying between said plug parts to be protected by said plug parts.

2. The cable harness described in claim 2 wherein:

said forward portion of said grounding cable contact extends along an axis and is exposed along most of its length in a majority of directions radial to said axis.

3. The cable harness described in claim 1 wherein:

said connector housing includes a connector circuit board having two rows of conductive signal traces each soldered to one of said wires and to one of said signal contacts, said connector circuit board having a slot which receives at least part of said cable and having a ground trace with a rear portion soldered to said cable shield and a front portion soldered to said grounding contact rearward portion.

4. The cable harness described in claim 1 including:

an IC card which has a frame with front and rear ends and laterally spaced opposite sides, said frame rear end having a middle and having a cavity on either side of said middle, with each cavity receiving one of said plug parts, and including a row of signal contacts in each of said cavities that engages a corresponding row of signal contacts of said cable harness connector when said connector mates with said card;

said middle of said frame rear end including a passage with an end restriction that passes a pin having no more than a predetermined width, said grounding cable contact forward portion forming a pin, and including a grounding socket contact lying in said passage of said frame middle behind said restriction and constructed to closely mate with said pin of said grounding cable contact forward portion;

said pin being of substantially said predetermined width, so only said pin and not any insulation of said cable connector, passes through said restriction.

5. The cable harness assembly described in claim 1 including:

an IC card which has front and rear ends and laterally spaced opposite sides, said card having a plurality of card signal contacts lying at said rear end for mating with said cable signal contacts and a grounding cable contact that mates with said grounding plug contact when said cable connector mates with said card rear end;

said IC card including a frame forming said front and rear ends, and a card circuit board mounted on said frame and having front and rear ends, said board having upper and lower surface and having a ground plane extending to said rear end of said lower surface, said board rear end having two laterally-spaced rows of signal traces on said upper surface which are each engaged with a different one of said card signal contacts;

said card circuit board having an upper ground trace lying between said rows of signal traces and connected to said ground plane at said rear end lower surface, with said ground card contact having a tail soldered to said upper ground trace.

6. The cable harness assembly described in claim 1 including:

an IC card which has a dielectric frame with front and rear ends and laterally spaced opposite sides, said card having two aligned rows of card signal contacts lying at said frame rear end for mating with said connector contacts and a grounding card socket contact that lies in said frame between said two aligned rows of signal contacts and that mates with said grounding cable contact when said cable connector mates with said card rear end, said forward portion of said grounding cable contact being pin-shaped;

said frame rear end having a grounding contact passage that receives said grounding socket contact, said passage having a restriction near the rear end thereof and having a wider front portion that is wider than said restriction and that extends forwardly from said restriction, said frame also has a cross beam extending between said frame opposite sides and spaced forward of said grounding contact passage;

said rear end having at least three vertical holes each extending across the height of said passage and forming most of the length of said passage rearward of said restriction, with at least one hole extending downwardly from the top of said frame to the bottom of said passage and at least one hole extending upwardly from the bottom of said frame to the top of said passage;

one of said holes forming a largely rearwardly facing frame shoulder and said grounding card contact forming a retainer shoulder that abuts said frame shoulder.

7. A cable harness for connecting to the input/output port at the rear of a thin IC card, comprising:

a connector which includes a housing with front and rear ends and laterally-spaced opposite sides, said front end forming two laterally-spaced plug parts each projecting forwardly at said housing front, each plug part having a row of contact-receiving passages;

a plurality of signal socket contacts, each lying in a different one of said contact receiving passages;

a cable having a plurality of wires and a shield around said wires, said cable having a front end lying in said connector housing with each of said wires connected to a different one of said socket contacts;

a grounding contact having a pin like forward portion extending along an axis, and a rearward portion electrically coupled to said cable shield;

said pin like forward portion of said grounding contact lying between said plug parts and being exposed in directions radial to said axis.

8. The cable harness described in claim 7 wherein:

said connector housing forms a substantially forwardly-facing shoulder with said plug parts projecting forward of said shoulder;

said grounding contact has a rear portion lying behind said shoulder and in said housing;

said housing includes a circuit board having a rear end with a slot that receives said cable front end;

said circuit board having a conductive ground trace with a rear end lying beside said slot and soldered to said cable shield and with a front end soldered to said grounding contact rear portion.

9. A card and cable combination, comprising:

an IC card having forward and rearward ends, a forward connector at said forward end for connection to an electronic apparatus that receives said card, and a rearward connector at said rearward end, said rearward connector having a plurality of card signal contacts;

a cable harness which includes a cable with a front end and a connector coupled to said cable front end, said cable connector being mated with said card rear connector, and said cable connector having a plurality of connector signal contacts mating with said card signal contacts, said connector being demateable from said card connector;

said cable connector having a cable grounding contact with a pin-shaped front end port which extends along an axis;

said card rearward connector including a grounding socket contact which receives said front end part of said cable grounding contact;

said pin-shaped received front end part of said cable grounding contact, being exposed in directions radial to said axis along the entire length thereof when said cable connector and card rearward connector are not mated.

10. The combination described in claim 9 wherein:

said cable connector has a forwardly-facing shoulder and a pair of plug parts projecting forwardly of said shoulder and lying on laterally opposite sides of and spaced from said pin-shaped front end part of said cable grounding contact, with said card signal contacts lying in said plug parts and said card being constructed to receive said plug parts.

11. The combination described in claim 9 wherein:

said card includes a frame having upper and lower surfaces and having a rear end with a middle and laterally spaced opposite sides, said card also having a card circuit board mounted on said frame with said board having upper and lower surfaces and forward and rear ends;

said card circuit board having a plurality of signal traces on its upper surface at the rear end thereof, and said card signal contacts having forward tails engaged with said signal traces;

said board having a ground plane lying on said lower board surface and extending to said rear end on said lower surface, said board having an upper ground trace lying on said upper surface at said middle of said rear end and connected to said ground plane at said rear end lower surface, and said grounding socket contact having a forwardly extending tail connected to said upper ground trace.

12. An IC card of the type which is designed to fit into a thin slot of an electronic apparatus, comprising:
- a plastic integrally molded IC card frame having longitudinally-spaced forward and rearward ends, laterally-spaced opposite sides, and vertically spaced top and bottom surfaces, said frame having elongated opposite side beams lying at said opposite sides and extending in said longitudinal direction, said frame having an integral rear connector housing part that extends between the rear ends of said side beams and that forms a plurality of longitudinally extending contact-receiving through passages, said frame also having a laterally extending cross beam spaced forwardly of said rear connector housing part;
- a first of said passages having a wide forward passage portion for receiving the rear portion of a grounding socket contact and having a rear passage portion forming a restriction of smaller width than said forward portion to prevent entrance of an oversize pin contact;
- said first passage has upper and lower passage walls and has at least three vertical holes forming said forward portion of said first passage, said vertical holes each extending vertically through one of said walls and through said passage but not through the opposite surface wall, with at least one hole extending through said top wall and at least one hole extending through said lower wall, to thereby enable molding despite said cross beam.

13. The IC card described in claim 12 wherein:
the frontmost of said holes extends through said upper wall and forms a ramp that extends rearwardly and at an upward incline, and a second of said holes lies adjacent but rearward of said frontmost hole and forms a rearwardly-facing shoulder in said lower surface wall at the rear end of said frontmost hole; and including
a grounding socket contact lying in said first passage, said socket contact having a resiliently compressible portion with a retainer that forms a forwardly-facing shoulder that lies against said rearwardly-facing shoulder.

14. The IC card described in claim 12 wherein:
said connector housing part of said frame has a plug-receiving cavity on either side of said first passage, and has a row of said passages extending forward of each of said cavities, with said first passage lying between said cavities; and including
a first socket contact lying in said first passage; and
a cable harness that includes a cable connector having a pair of laterally-spaced plug parts that each is receivable in one of said cavities, said cable connector having a laterally and vertically exposed pin contact that lies between said plug parts and that can be received in said first socket contact.

* * * * *